US 9,768,729 B2

(12) United States Patent
Sugiura et al.

(10) Patent No.: US 9,768,729 B2
(45) Date of Patent: Sep. 19, 2017

(54) POWER AMPLIFIER

(71) Applicant: Murata Manufacturing Co., Ltd., Kyoto (JP)

(72) Inventors: Kazuma Sugiura, Kyoto (JP); Takashi Yamada, Kyoto (JP); Norio Hayashi, Kyoto (JP); Satoshi Tanaka, Kyoto (JP); Kenichi Shimamoto, Kyoto (JP); Kazuo Watanabe, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 7 days.

(21) Appl. No.: 14/862,865

(22) Filed: Sep. 23, 2015

(65) Prior Publication Data

US 2016/0134241 A1 May 12, 2016

Related U.S. Application Data

(60) Provisional application No. 62/078,612, filed on Nov. 12, 2014.

(51) Int. Cl.
*H03F 3/68* (2006.01)
*H03F 1/02* (2006.01)
*H03F 3/19* (2006.01)
*H03F 3/21* (2006.01)
*H03F 3/24* (2006.01)

(52) U.S. Cl.
CPC ......... *H03F 1/0205* (2013.01); *H03F 1/0222* (2013.01); *H03F 3/19* (2013.01); *H03F 3/211* (2013.01); *H03F 3/245* (2013.01); *H03F 2200/451* (2013.01); *H03F 2200/516* (2013.01); *H03F 2200/555* (2013.01)

(58) Field of Classification Search
CPC ...................................................... H03F 3/602
USPC .................................. 330/295, 296, 285, 288
See application file for complete search history.

(56) References Cited

U.S. PATENT DOCUMENTS

| 7,683,712 B2* | 3/2010 | Suzaki ..................... H03F 1/30 330/129 |
| 2009/0051437 A1* | 2/2009 | Yamamoto .............. H03F 1/302 330/285 |

FOREIGN PATENT DOCUMENTS

| JP | 2003-324325 A | 11/2003 |
| JP | 2011-130066 A | 6/2011 |

* cited by examiner

*Primary Examiner* — Khanh V Nguyen
*Assistant Examiner* — Khiem Nguyen
(74) *Attorney, Agent, or Firm* — Pearne & Gordon, LLP

(57) ABSTRACT

A power amplifier has improved power added efficiency at high output power. The power amplifier includes: a first transistor for amplifying an input signal input to the base thereof and outputting the amplified signal from the collector thereof; a second transistor with power-supply voltage applied to the collector thereof to supply bias voltage or bias current from the emitter thereof to the base of the first transistor; a third transistor whose collector is connected to the collector of the first transistor to amplify the input signal input to the base thereof and output the amplified signal from a collector thereof; a fourth transistor whose base and collector are connected to supply bias from the emitter thereof to the base of the third transistor; and a first resistor with bias control voltage applied to one end thereof and the other end connected to the bases of the second and fourth transistors.

10 Claims, 15 Drawing Sheets

POWER AMPLIFIER

CROSS-REFERENCE TO RELATED APPLICATIONS

This application claims priority to U.S. Provisional Patent Application Ser. No. 62/078,612, filed on Nov. 12, 2014, entitled "POWER AMPLIFIER", the entirety of which is incorporated herein by reference.

BACKGROUND OF THE INVENTION

Field of the Invention
The present disclosure relates to a power amplifier.
Background Art
A mobile communication device such as a cellular phone employs a power amplifier to amplify power of a radio frequency (RF) signal to be transmitted to a base station.

For example, Patent Document 1 discloses a power amplifier including multiple unit cells. Each unit cell includes an amplification transistor and a bias circuit for supplying bias to the base of the transistor.

CITATION LIST

Patent Document

[Patent Document 1] JP2011-130066 A

SUMMARY OF THE INVENTION

As disclosed in Patent Document 1, such a structure to supply bias to the base of an amplification transistor is known. However, as the output level increases, current flowing from the bias circuit into the base of the amplification transistor increases, resulting in a decrease in power added efficiency (PAE).

The present disclosure has been made in view of such circumstances, and it is an object thereof to improve the power added efficiency of a power amplifier at high output power.

A power amplifier according to one aspect of the present disclosure includes: a first transistor for amplifying an input signal input to the base of the first transistor and outputting an amplified signal from the collector of the first transistor; a second transistor with power-supply voltage applied to a collector of the second transistor to supply a first bias voltage or a first bias current from the emitter of the second transistor to the base of the first transistor; a third transistor whose collector is connected to the collector of the first transistor to amplify the input signal input to the base of the third transistor and output the amplified signal from the collector of the third transistor; a fourth transistor whose base and collector are connected to supply a second bias voltage or a second bias current from the emitter of the fourth transistor to the base of the third transistor; and a first resistor with a bias control voltage applied to one end of the first resistor and the other end of the first resistor connected to the bases of the second and fourth transistors.

According to the present disclosure, the power added efficiency of a power amplifier at high output power can be improved.

DESCRIPTION OF THE PREFERRED EMBODIMENTS

Figure 1:
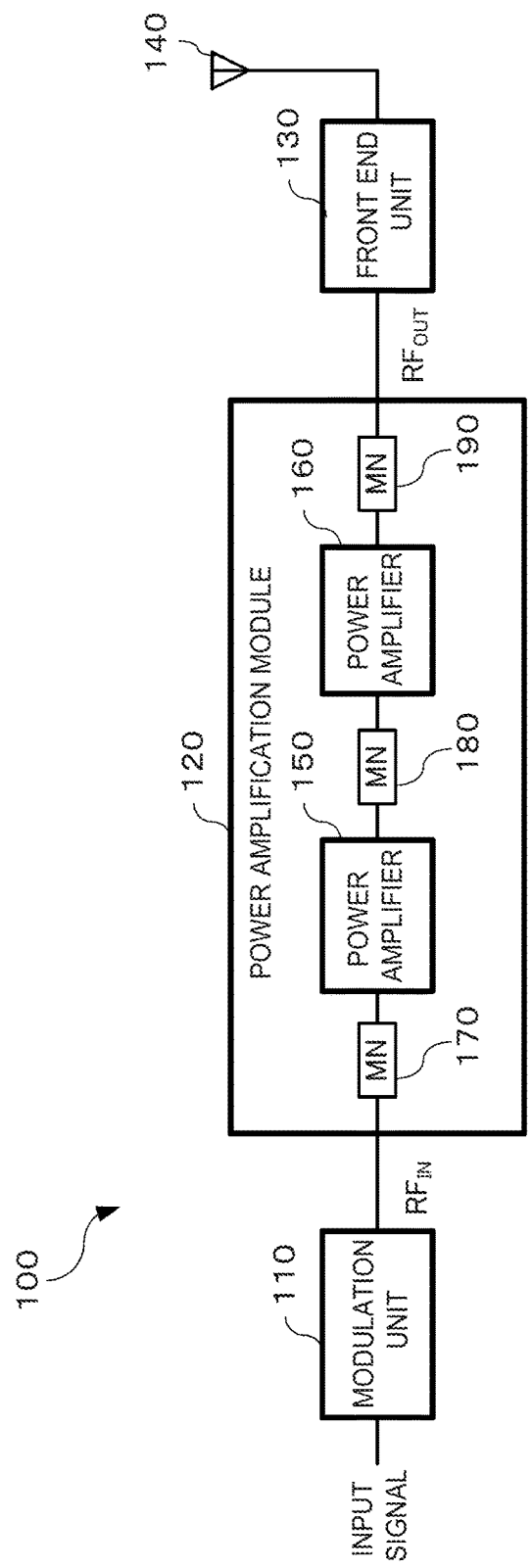
FIG. 1 is a diagram illustrating a configuration example of a transmitting unit including a power amplifier module as one embodiment of the present disclosure.

Embodiments of the present disclosure will be described below with reference to the accompanying drawings. FIG. 1 is a diagram illustrating a configuration example of a transmitting unit including a power amplification module as one embodiment of the present disclosure. A transmitting unit 100 is used, for example, in a mobile communication device such as a cellular phone to transmit various signals such as voice and data to a base station. Although the mobile communication device also includes a receiving unit for receiving signals from the base station, the description thereof will be omitted here.

As illustrated in FIG. 1, the transmitting unit 100 includes a modulation unit 110, a power amplification module 120, a front end unit 130, and an antenna 140.

The modulation unit 110 modulates an input signal based on a GSM modulation system or the like to generate an RF signal in order to perform radio transmission. For example, the RF signal ranges from about hundreds of MHz to several GHz.

The power amplification module 120 amplifies the power of the RF signal ($RF_{IN}$) to a level for transmission to a base station, and outputs the amplified signal ($RF_{OUT}$). For example, the power amplification module 120 can be made up of two-stage power amplifiers. Specifically, as illustrated in FIG. 1, the power amplification module 120 can include power amplifiers 150, 160 and matching circuits (MN: Matching Networks) 170, 180, and 190. The power amplifier 150 is a first-stage (drive-stage) amplifier to amplify an input RF signal and output the amplified signal. The power amplifier 160 is a second-stage (power-stage) amplifier to amplify the input RF signal and output the amplified signal. The matching circuits 170, 180, and 190 are circuits for matching impedance between circuits, and each matching circuit is made up using a capacitor and an inductor. Note that the number of stages of power amplifiers that constitute the power amplification module 120 is not limited to the two stages, and it may be one stage, or three or more stages.

The front end unit 130 performs filtering on the amplified signal, switching to a received signal received from the base station, and the like. The amplified signal output from the front end unit 130 is transmitted to the base station through the antenna 140.

Figure 2:
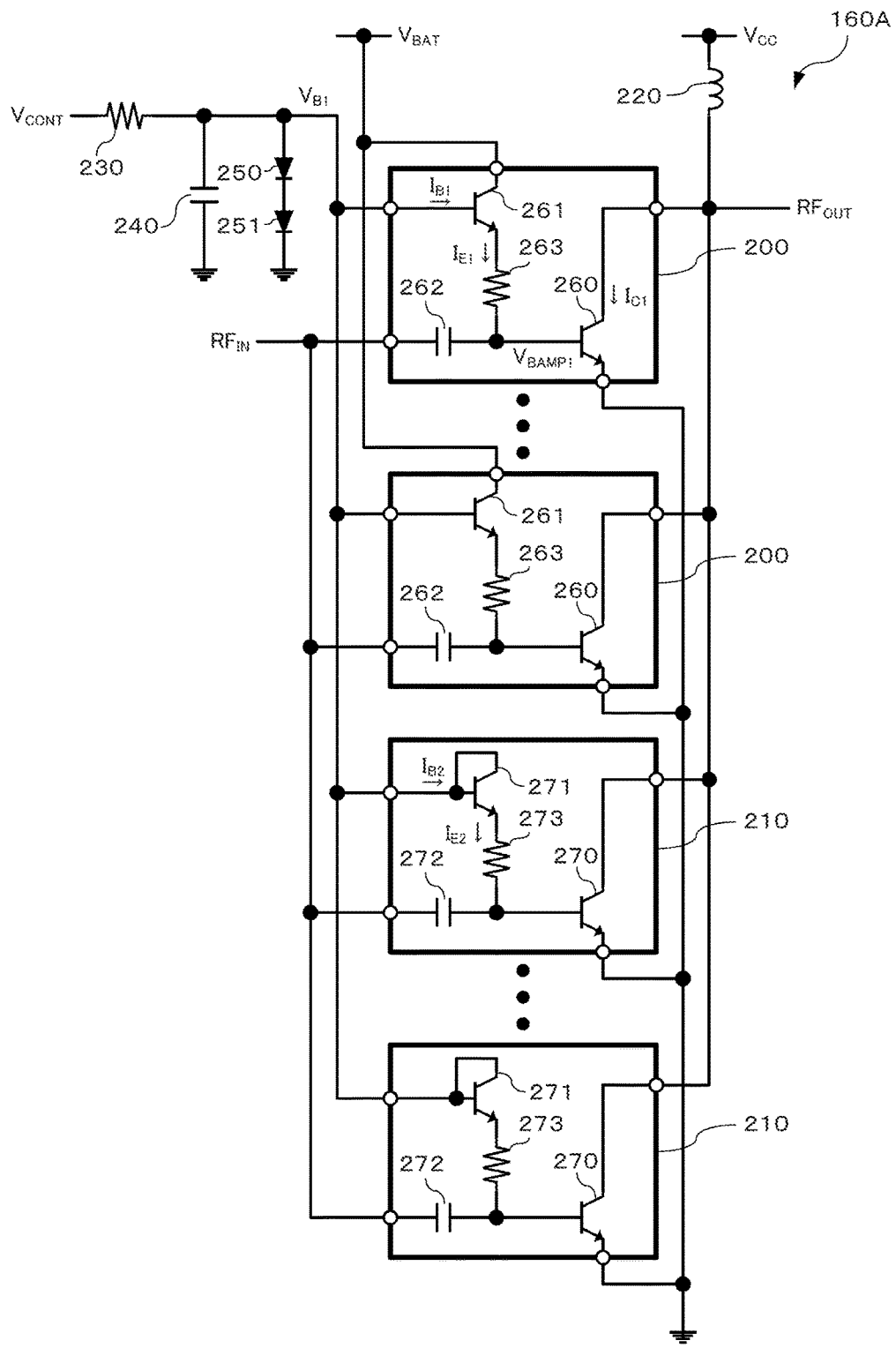
FIG. 2 is a diagram illustrating the configuration of a power amplifier 160A as an example of the configuration of a power amplifier 160.

FIG. 2 is a diagram illustrating the configuration of a power amplifier 160A as an example of the configuration of the power amplifier 160. The power amplifier 160A includes unit cells 200, 210, an inductor 220, a resistor 230, a capacitor 240, and diodes 250, 251.

Each of the unit cells 200, 210 is a cell including an amplification transistor, respectively. The power amplifier 160A includes multiple (e.g. 16) unit cells. In the power amplifier 160A, some of the multiple unit cells are unit cells 200 and the other unit cells are unit cells 210. Note that the number of unit cells 200, 210 may be one, respectively.

Each of the unit cells 200 includes NPN transistors (hereinafter, simply called "transistors") 260, 261, a capacitor 262, and a resistor 263. The transistors 260, 261 are, for example, heterojunction bipolar transistors (HBTs).

As for the transistor 260 (first transistor), power-supply voltage $V_{CC}$ is supplied to the collector through the inductor 220, the RF signal ($RF_{IN}$) is input to the base through the capacitor 262, and the emitter is grounded. Further, bias is supplied from the emitter of the transistor 261 to the base of the transistor 260. The transistor 260 amplifies the RF signal input to the base, and outputs the amplified signal from the collector.

As for the transistor 261 (second transistor), battery voltage $V_{BAT}$ is supplied to the collector, bias control voltage $V_{CONT}$ is supplied to the base through the resistor 230, and the emitter is connected to one end of the resistor 263. One end of the resistor 263 is connected to the emitter of the transistor 261, and the other end is connected to the base of the transistor 260. The transistor 261 and the resistor 263 output bias current to the base of the transistor 260 based on the bias control voltage $V_{CONT}$.

The RF signal is input to one end of the capacitor 262, and the other end of the capacitor 262 is connected to the base of the transistor 260. The capacitor 262 cuts a DC component of the RF signal and outputs the RF signal to the base of the transistor 260.

The unit cell 210 includes transistors 270, 271, a capacitor 272, and a resistor 273. The transistors 270, 271 are, for example, HBTs.

As for the transistor 270 (third transistor), the power-supply voltage $V_{CC}$ is supplied to the collector through the inductor 220, the RF signal ($RF_{IN}$) is input to the base through the capacitor 272, and the emitter is grounded. Further, bias is supplied from the emitter of the transistor 271 to the base of the transistor 270. The transistor 270 amplifies the RF signal input to the base, and outputs the amplified signal from the collector.

The transistor 271 (fourth transistor) is diode-connected, where the bias control voltage $V_{CONT}$ is supplied to the base through the resistor 230, and the emitter is connected to one end of the resistor 273. One end of the resistor 273 is connected to the emitter of the transistor 271, and the other end is connected to the base of the transistor 270. The transistor 271 and the resistor 273 output bias current to the base of the transistor 270 based on the bias control voltage $V_{CONT}$. Note that "diode connection" is a form of connecting the base and collector of a transistor to use a diode between the base and emitter of the transistor.

The RF signal is input to one end of the capacitor 272, and the other end of the capacitor 272 is connected to the base of the transistor 270. The capacitor 272 cuts the DC component of the RF signal and outputs the RF signal to the base of the transistor 270.

The power-supply voltage $V_{CC}$ is applied to one end of the inductor 220, and the other end of the inductor 220 is connected to the collectors of the transistors 260, 270. The power-supply voltage $V_{CC}$ is, for example, a predetermined level of voltage generated by a regulator.

The bias control voltage $V_{CONT}$ is applied to one end of the resistor 230, and the other end of the resistor 230 is connected to the bases of the transistors 261, 271.

One end of the capacitor 240 is connected to the bases of the transistors 261, 271, and the other end of the capacitor 240 is grounded. The capacitor 240 can reduce noise input to the bases of the transistors 261, 271.

The diodes 250 and 251 are connected in series, where the anode of the diode 250 is connected to the bases of the transistors 261, 271, and the cathode of the diode 251 is grounded. The diodes 250 and 251 can reduce fluctuations in base voltage of the transistors 261, 271 with respect to variations in bias control voltage $V_{CONT}$.

As illustrated in FIG. 2, the unit cells 200, 210 are connected in parallel. In other words, the transistors 260, 270 output the amplified signal $RF_{OUT}$ from the collectors commonly connected.

In the power amplifier 160A, the transistors 260, 270 need larger amounts of bias current as the output power becomes higher.

Here, when the bias current supplied from the transistor 261 to the transistor 260 is denoted by $I_{E1}$, the base current of the transistor 261 is denoted by $I_{B1}$, and the current amplification factor of the transistor 261 is denoted by hFE, $I_{B1}=(1/(hFE+1))\times I_{E1}$. In other words, the amount of increase in base current $I_{B1}$ relative to the amount of increase in bias current $I_{E1}$ in the unit cell 200 is $1/(hFE+1)$ times.

On the other hand, when the bias current supplied from the transistor 271 to the transistor 270 is denoted by $I_{E2}$, and current flowing into the base and collector of the transistor 271 is denoted by $I_{BC2}$, $I_{BC2}=I_{E2}$ because the transistor 271 is diode-connected. In other words, the amount of increase in $I_{BC2}$ relative to the amount of increase in bias current $I_{E2}$ in the unit cell 210 is 1 times.

The amount of increase in current flowing into the bias transistor 271 relative to the amount of increase in bias current in the unit cell 210 becomes larger than that in the unit cell 200. Therefore, current flowing into the resistor 230 increases in the power amplifier 160A, compared with a configuration in which all unit cells are unit cells 200, resulting in a large voltage drop across the resistor 230. This difference becomes particularly pronounced at high output power. Thus, in the power amplifier 160A, the base voltage $V_{B1}$ of the transistors 261, 271 decreases at high output power. The decrease in base voltage $V_{B1}$ decreases the base voltage of the transistors 260, 270, reducing the collector current of the transistors 260, 270.

As mentioned above, as the RF signal to be input increases, current flowing into the transistors 260, 270 increases. It should be noted here that an increase in current with a change in RF signal is not the minimum amount of current to output power being output at that time. The unit cell 210 functions to suppress this excess current. As a result, power added efficiency at high output power can be improved in the power amplifier 160A.

Based on simulation results, the following describes that the power added efficiency is improved by the power amplifier 160A.

Figure 3:
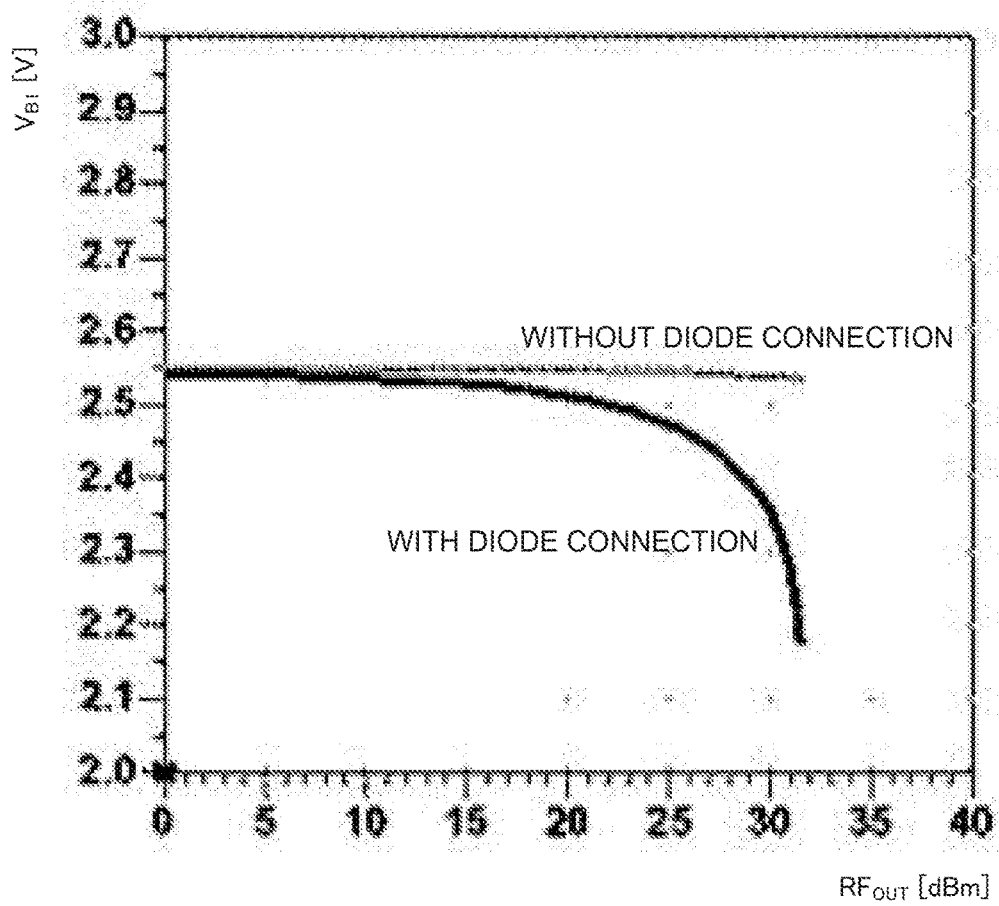
FIG. 3 is a graph illustrating simulation results that indicate a relationship between output power and voltage $V_{B1}$.
Figure 4:
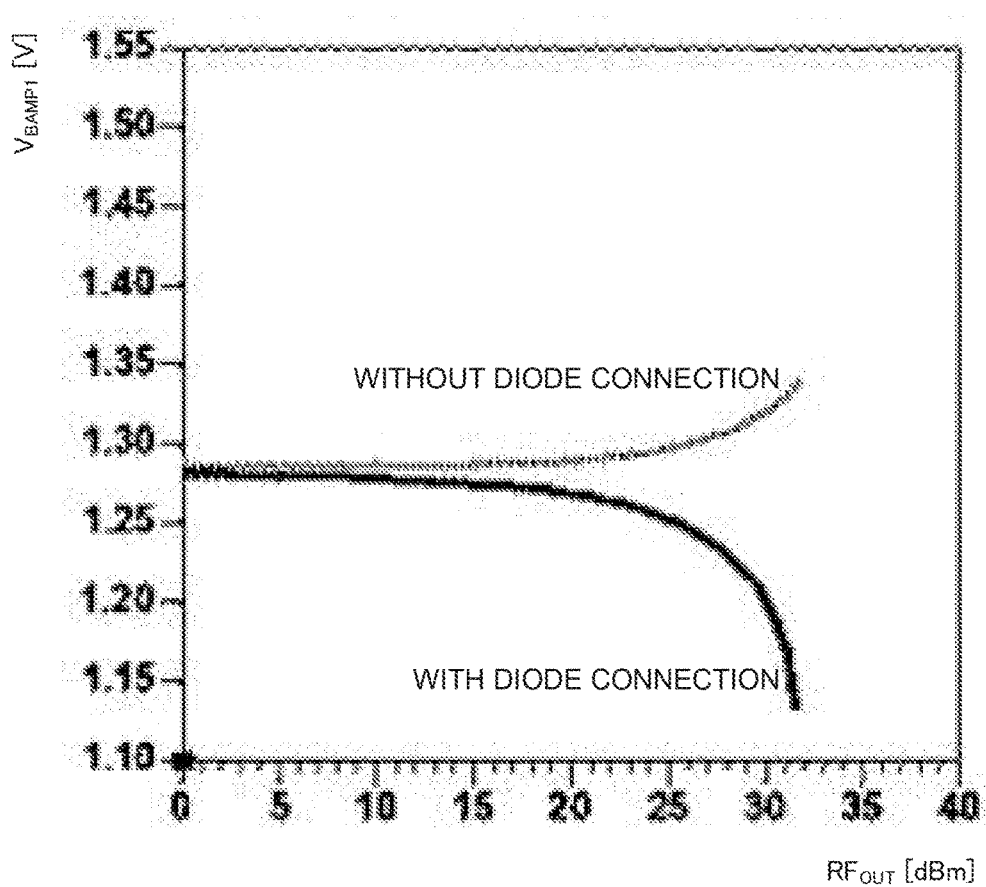
FIG. 4 is a graph illustrating simulation results that indicate a relationship between output power and voltage $V_{BAMP1}$.
Figure 5:
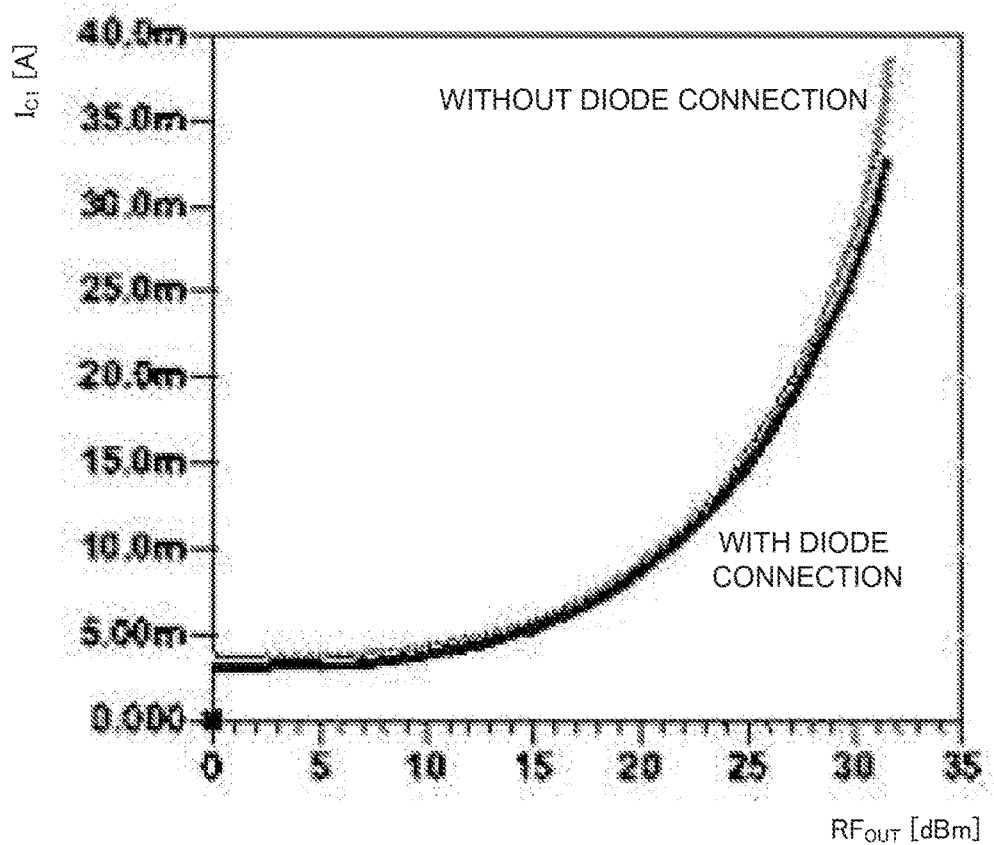
FIG. 5 is a graph illustrating simulation results that indicate a relationship between output power and current $I_{C1}$.

FIG. 3 to FIG. 5 illustrate simulation results when the power amplifier 160A is made up of 16 unit cells 200 (without diode connection) and when the power amplifier 160A is made up of 14 unit cells 200 and two unit cells 210 (with diode connection).

FIG. 3 is a graph illustrating simulation results that indicate a relationship between output power and voltage $V_{B1}$. In FIG. 3, the abscissa (x-axis) indicates the output power (dBm) of the amplified signal $RF_{OUT}$ of the power amplifier 160A, and the ordinate (y-axis) indicates base voltage $V_{B1}$ (V). Note that the base voltage $V_{B1}$ is the base voltage of the transistors 261, 271.

FIG. 4 is a graph illustrating simulation results that indicate a relationship between output power and voltage $V_{BAMP1}$. In FIG. 4, the abscissa indicates the output power (dBm) of the amplified signal $RF_{OUT}$ of the power amplifier 160A, and the ordinate indicates voltage $V_{BAMP1}$ (V). Note that the voltage $V_{BAMP1}$ is the base voltage of the transistor 260.

FIG. 5 is a graph illustrating simulation results that indicate a relationship between output power and current $I_{C1}$. In FIG. 5, the abscissa indicates the output power (dBm) of the amplified signal $RF_{OUT}$ of the power amplifier 160A, and the ordinate indicates current $I_{C1}$ (A). Note that the current $I_{C1}$ is the collector current of the transistor 260.

As illustrated in FIG. 3, the base voltage $V_{B1}$ drops in an area of high output power in the configuration with diode connection. Along with this, as illustrated in FIG. 4, the voltage $V_{BAMP1}$ drops in the area of high output power in the configuration with diode connection. Therefore, as illustrated in FIG. 5, the current $I_C$ decreases in the area of high output power in the configuration with diode connection. According to this simulation result, it is found that power added efficiency at high output power is improved in the power amplifier 160A.

Figure 6:
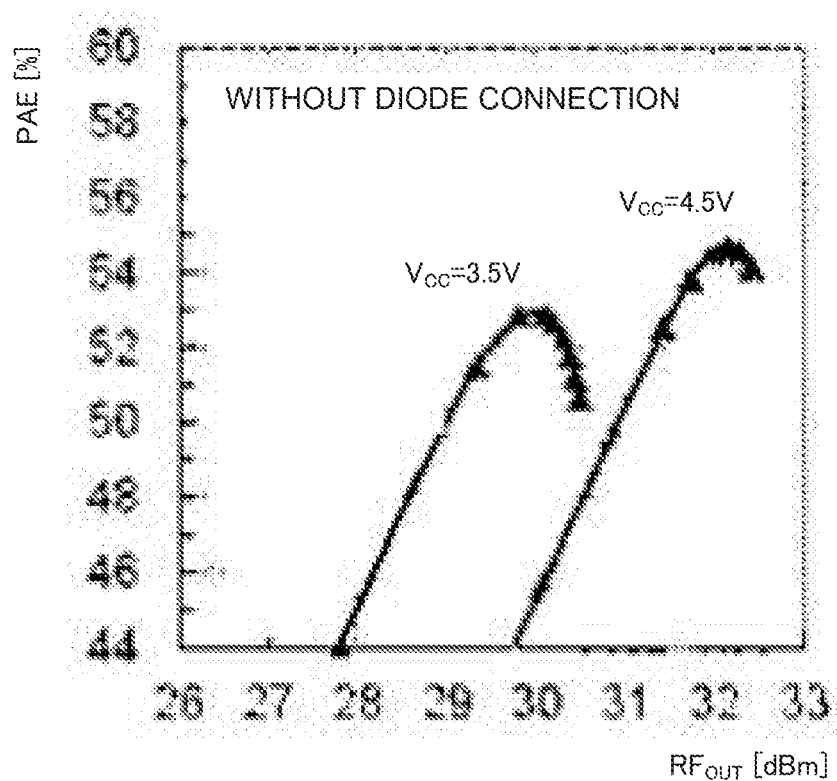
FIG. 6 is a graph illustrating experimental results when the power amplifier 160A is made up of 16 unit cells 200 (without diode connection).
Figure 7:
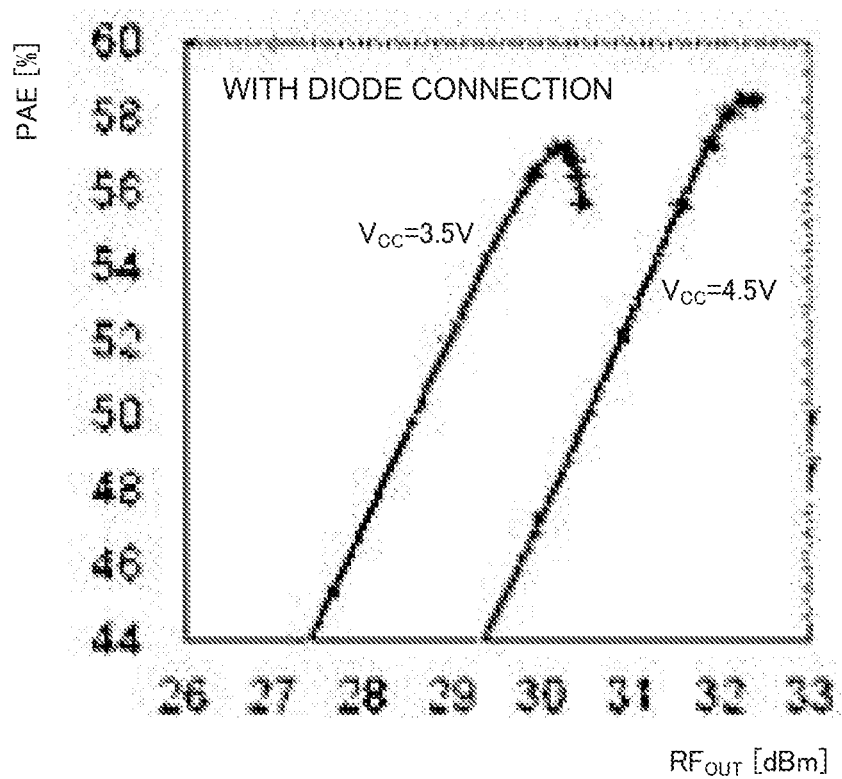
FIG. 7 is a graph illustrating experimental results when the power amplifier 160A is made up of 14 unit cells 200 and two unit cells 210 (with diode connection).

Further, a result of experimental verification that power added efficiency is improved by the power amplifier 160A is illustrated. FIG. 6 is a graph illustrating experimental results when the power amplifier 160A is made up of 16 unit cells 200 (without diode connection). FIG. 7 is a graph illustrating experimental results when the power amplifier 160A is made up of 14 unit cells 200 and two unit cells 210 (with diode connection). In FIG. 6 and FIG. 7, the abscissa indicates the output power (dBm) of the amplified signal $RF_{OUT}$ of the power amplification module 120, and the ordinate indicates the power added efficiency (%) of the power amplification module 120. Note that the power amplifier 150 in the drive stage of the power amplification module 120 is made up of 16 unit cells 200.

From a comparison between FIG. 6 and FIG. 7, it is found that power added efficiency is improved in the area of high output power in the configuration with diode connection. Thus, it is also found from the experimental results that power added efficiency is improved by the power amplifier 160A.

Figure 8:
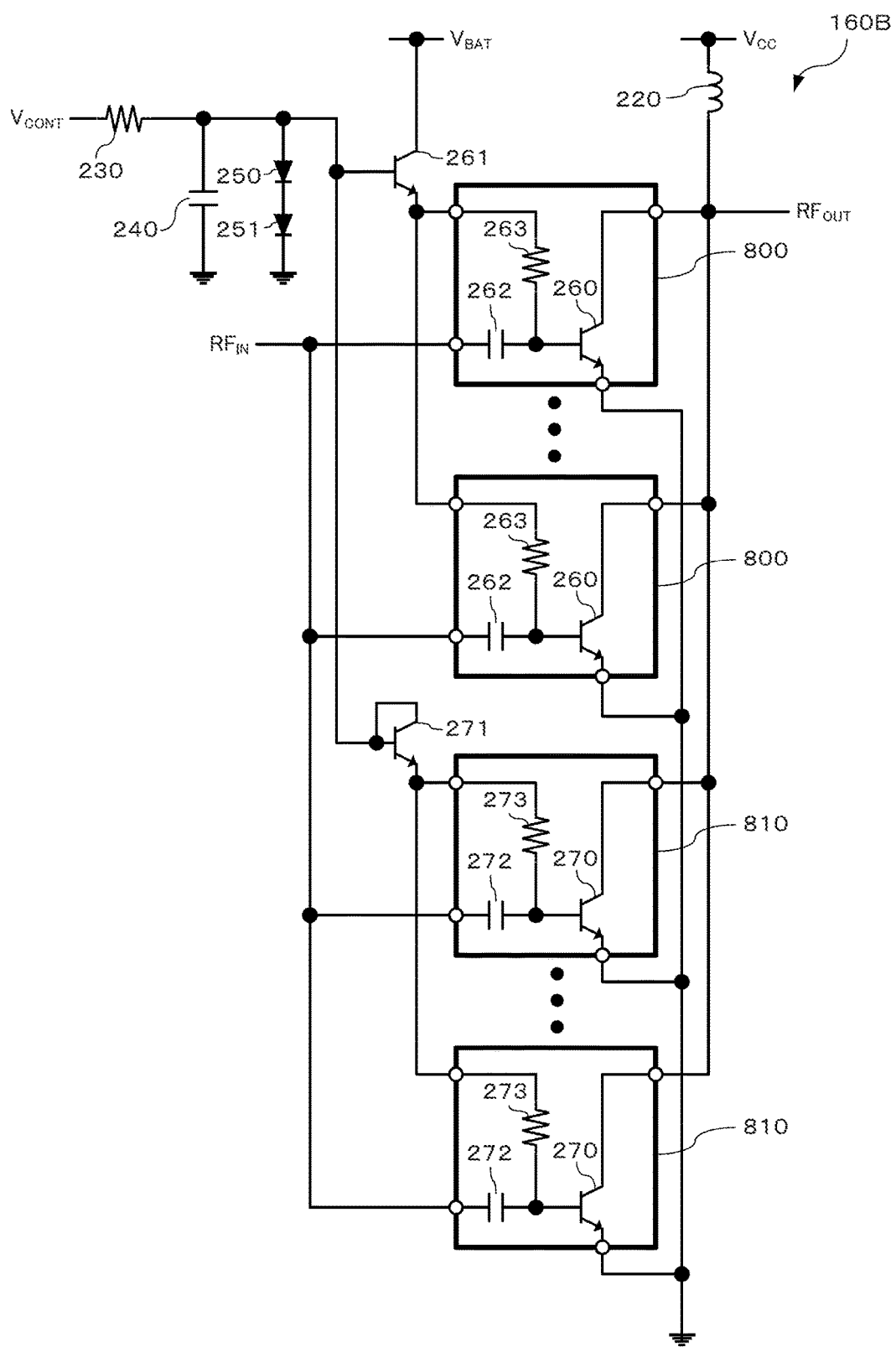
FIG. 8 is a diagram illustrating the configuration of a power amplifier 160B as another example of the configuration of the power amplifier 160.

FIG. 8 is a diagram illustrating the configuration of a power amplifier 160B as another example of the configuration of the power amplifier 160. Note that the same components as those in the power amplifier 160A are given the same reference numerals to omit the description thereof.

The power amplifier 160B includes unit cells 800, 810, an inductor 220, a resistor 230, a capacitor 240, diodes 250, 251, and transistors 261, 271.

Each of the unit cells 800 has the same structure as each of the unit cells 200 of the power amplifier 160A except that the unit cell 800 does not include the transistor 261. As illustrated in FIG. 8, one transistor 261 is provided outside the multiple unit cells 800. In other words, the emitter of the transistor 261 is connected to one end of a resistor 263 in each unit cell 800.

Each of the unit cells 810 has the same structure as each of the unit cells 210 of the power amplifier 160A except that the unit cell 810 does not include the transistor 271. As illustrated in FIG. 8, one diode-connected transistor 271 is provided outside the multiple unit cells 810. In other words, the emitter of the transistor 271 is connected to one end of a resistor 273 in each unit cell 810.

Even in such a configuration that the transistors 261 and 271 are shared among the multiple unit cells 800, 810, current flowing into the resistor 230 at high output power increases due to the diode-connected transistor 271. This can lead to an improvement in power added efficiency at high output power in the power amplifier 160B like in the power amplifier 160A.

Figure 9:
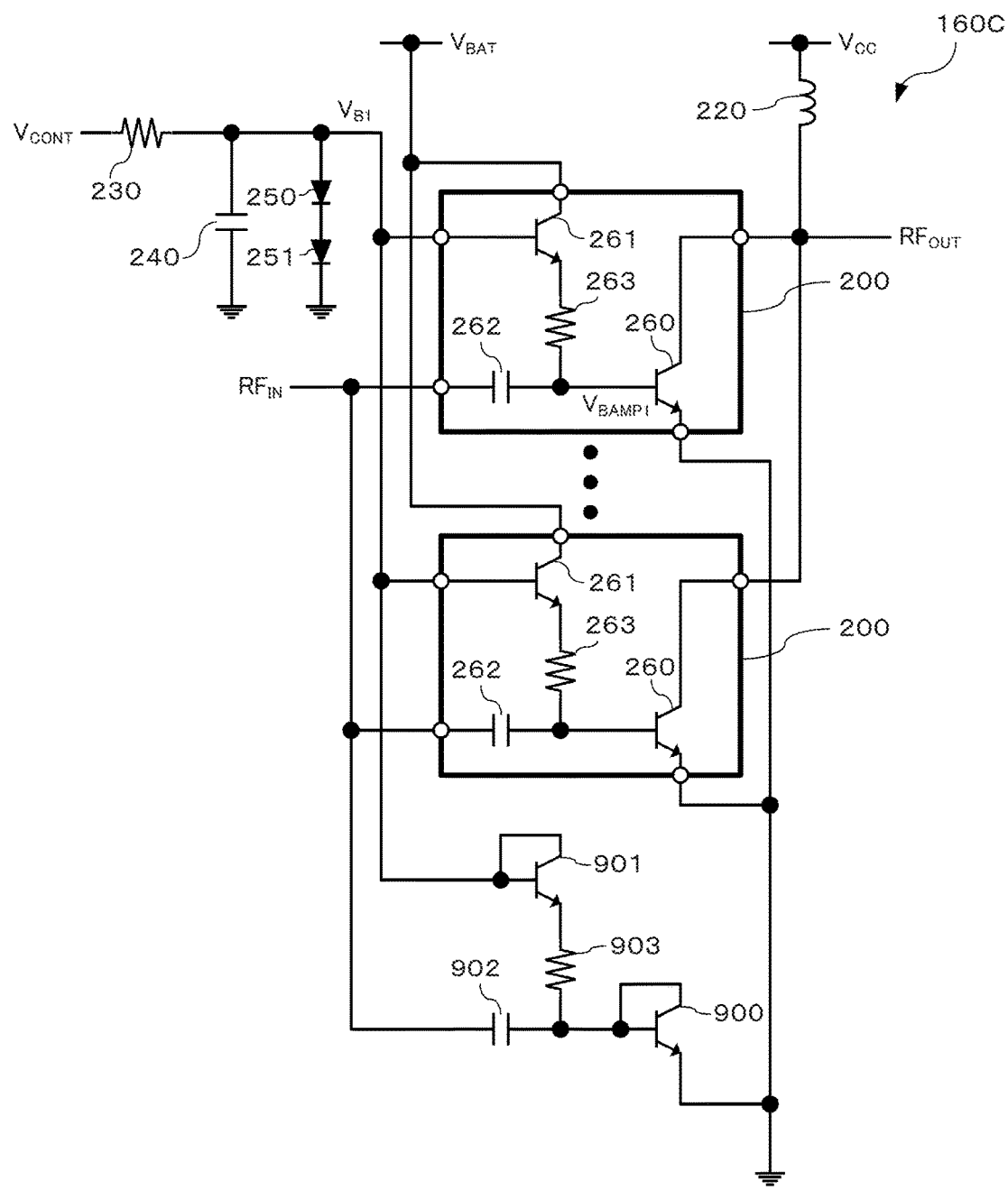
FIG. 9 is a diagram illustrating the configuration of a power amplifier 160C as still another example of the configuration of the power amplifier 160.

FIG. 9 is a diagram illustrating the configuration of a power amplifier 160C as still another example of the configuration of the power amplifier 160. Note that the same components as those in the power amplifier 160A are given the same reference numerals to omit the description thereof.

The power amplifier 160C includes unit cells 200, an inductor 220, a resistor 230, a capacitor 240, diodes 250, 251, transistors 900, 901, a capacitor 902, and a resistor 903. The transistors 900, 901 are, for example, HBTs.

The transistor 900 (fifth transistor) is diode-connected, where the RF signal ($RF_{IN}$) is input to the base through the capacitor 902, and the emitter is grounded.

The transistor 901 (sixth transistor) is diode-connected, where the bias control voltage $V_{CONT}$ is supplied to the base through the resistor 230, and the emitter is connected to one end of the resistor 903. One end of the resistor 903 is connected to the emitter of the transistor 901, and the other end is connected to the base of the transistor 900.

In the power amplifier 160C, current flowing into the transistor 900 increases as the RF signal increases. Along with this, current flowing into the transistor 901 also increases. As a result, a voltage drop due to the resistor 230 becomes large, resulting in a decrease in the base voltage $V_{B1}$ of the transistor 261. The decrease in base voltage $V_{B1}$ decreases the base voltage of the transistor 260, reducing the collector current of the transistor 260. This can lead to an improvement in power added efficiency at high output power in the power amplifier 160C.

Based on simulation results, the following describes that the power added efficiency is improved by the power amplifier 160C.

Figure 10:
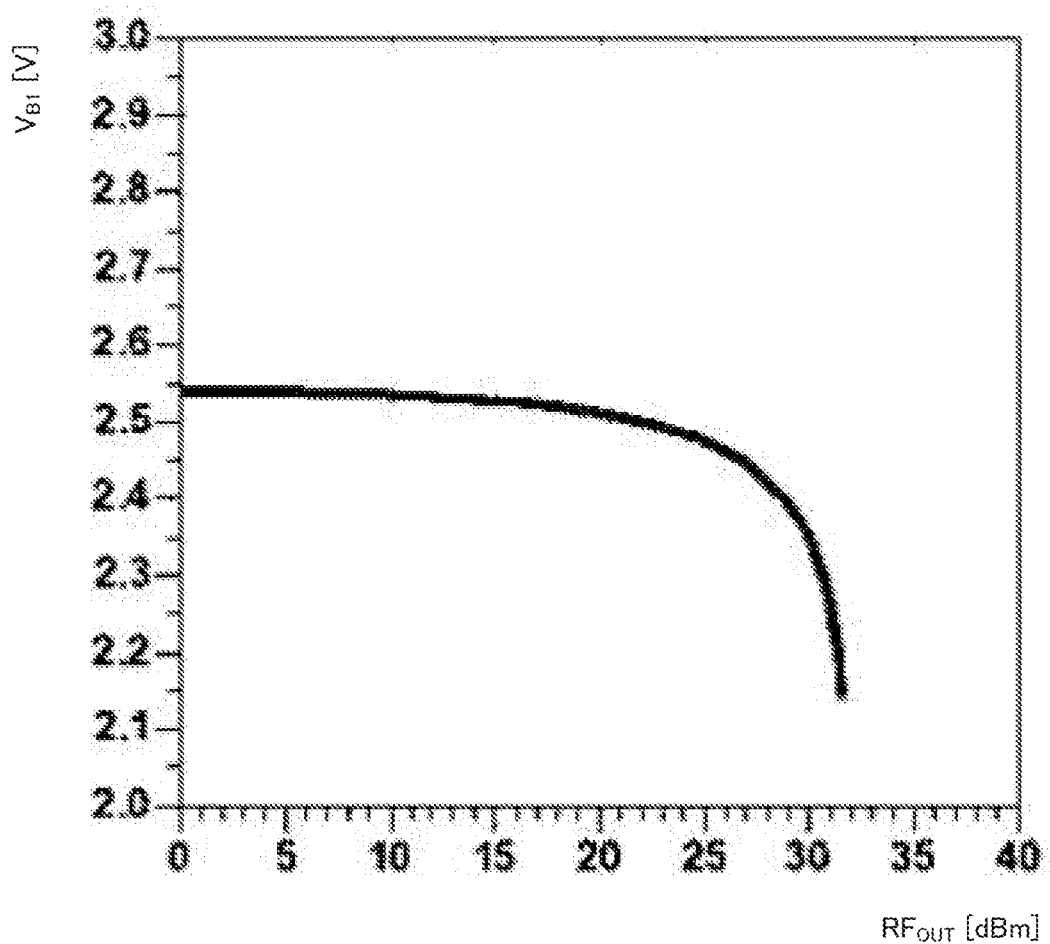
FIG. 10 is a graph illustrating simulation results that indicate a relationship between output power and base voltage $V_{B1}$.
Figure 11:
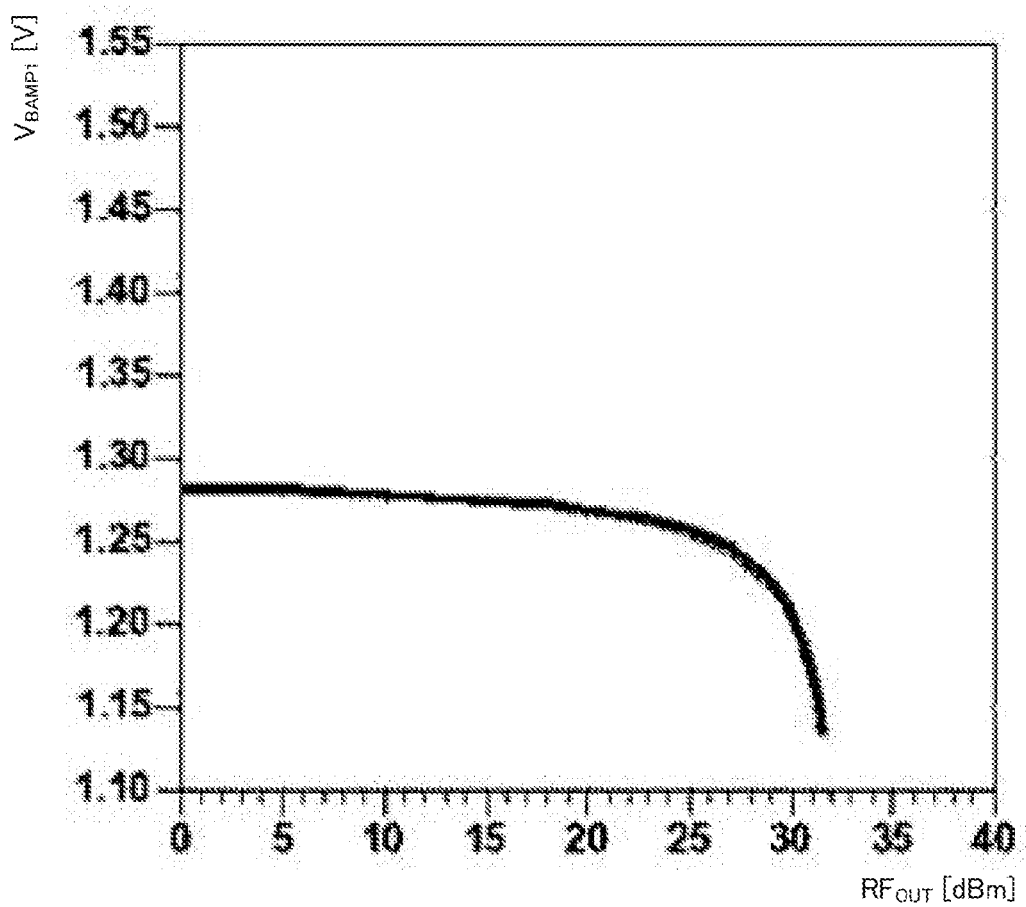
FIG. 11 is a graph illustrating simulation results that indicate a relationship between output power and voltage $V_{BAMP1}$.
Figure 12:
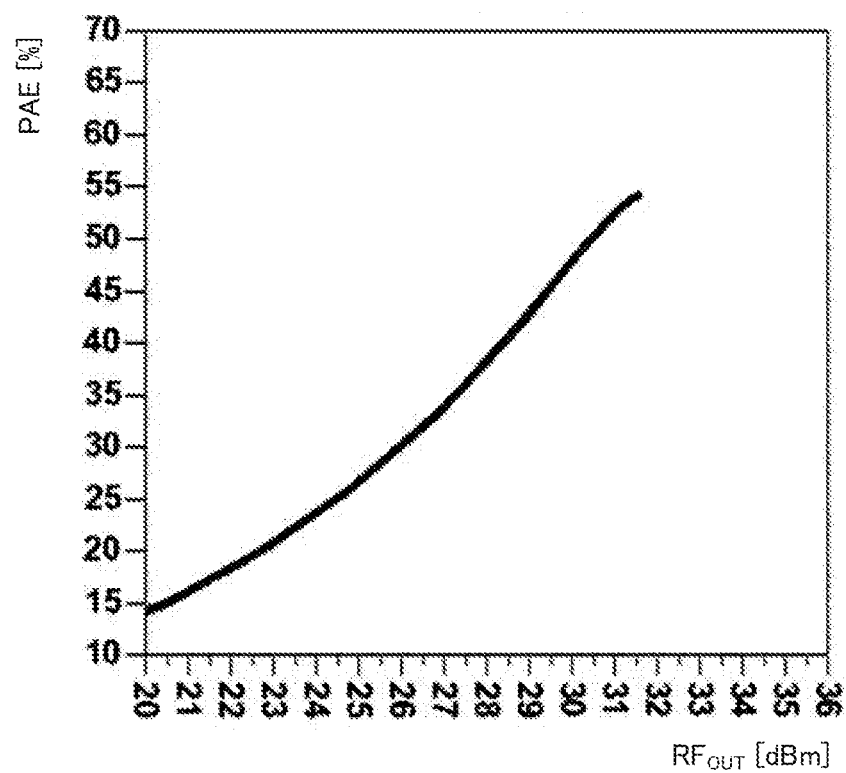
FIG. 12 is a graph illustrating simulation results that indicate a relationship between output power and power added efficiency.

FIG. 10 to FIG. 12 illustrate simulation results when the power amplifier 160C has a configuration including 16 unit cells 200 and the transistors 900, 901.

FIG. 10 is a graph illustrating simulation results that indicate a relationship between output power and base voltage $V_{B1}$. In FIG. 10, the abscissa indicates the output power (dBm) of the amplified signal $RF_{OUT}$ of the power amplifier 160C, and the ordinate indicates base voltage $V_{B1}$ (V). Note that the base voltage $V_{B1}$ is the base voltage of the transistor 261.

FIG. 11 is a graph illustrating simulation results that indicate a relationship between output power and voltage $V_{BAMP1}$. In FIG. 11, the abscissa indicates the output power (dBm) of the amplified signal $RF_{OUT}$ of the power amplifier 160C, and the ordinate indicates voltage $V_{BAMP1}$ (V). Note that the voltage $V_{BAMP1}$ is the base voltage of the transistor 260.

FIG. 12 is a graph illustrating simulation results that indicate a relationship between output power and power added efficiency. In FIG. 12, the abscissa indicates the output power (dBm) of the amplified signal $RF_{OUT}$ of the power amplifier 160C, and the ordinate indicates power added efficiency (%).

As illustrated in FIG. 10, the base voltage $V_{B1}$ drops in an area of high output power in the power amplifier 160C. Along with this, as illustrated in FIG. 11, the voltage $V_{BAMP1}$ drops in the area of high output power. Thus, as illustrated in FIG. 12, the power added efficiency in the area of high output power is improved in the power amplifier 160C.

Figure 13:
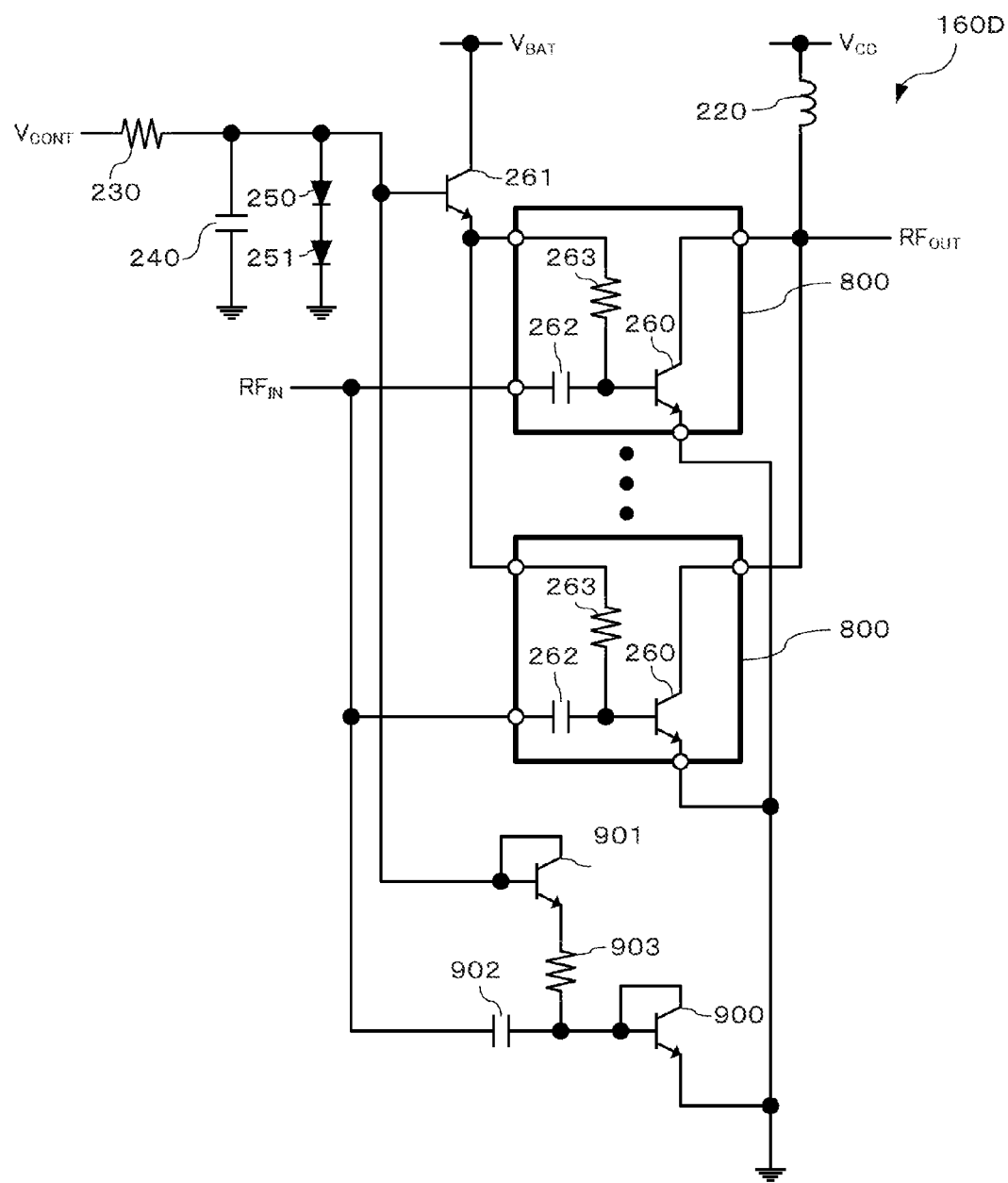
FIG. 13 is a diagram illustrating the configuration of a power amplifier 160D as yet another example of the configuration of the power amplifier 160.

FIG. 13 is a diagram illustrating the configuration of a power amplifier 160D as yet another example of the configuration of the power amplifier 160. Note that the same components as those in the power amplifiers 160B and 160C are given the same reference numerals to omit the description thereof.

The power amplifier 160D includes the unit cells 800 and the transistor 261 in the power amplifier 160B instead of the unit cells 200 in the power amplifier 160C. Even in such a configuration that the transistor 261 is shared among the multiple unit cells 800, the diode-connected transistors 900, 901 can improve power added efficiency at high output power like in the power amplifier 160C.

Figure 14:
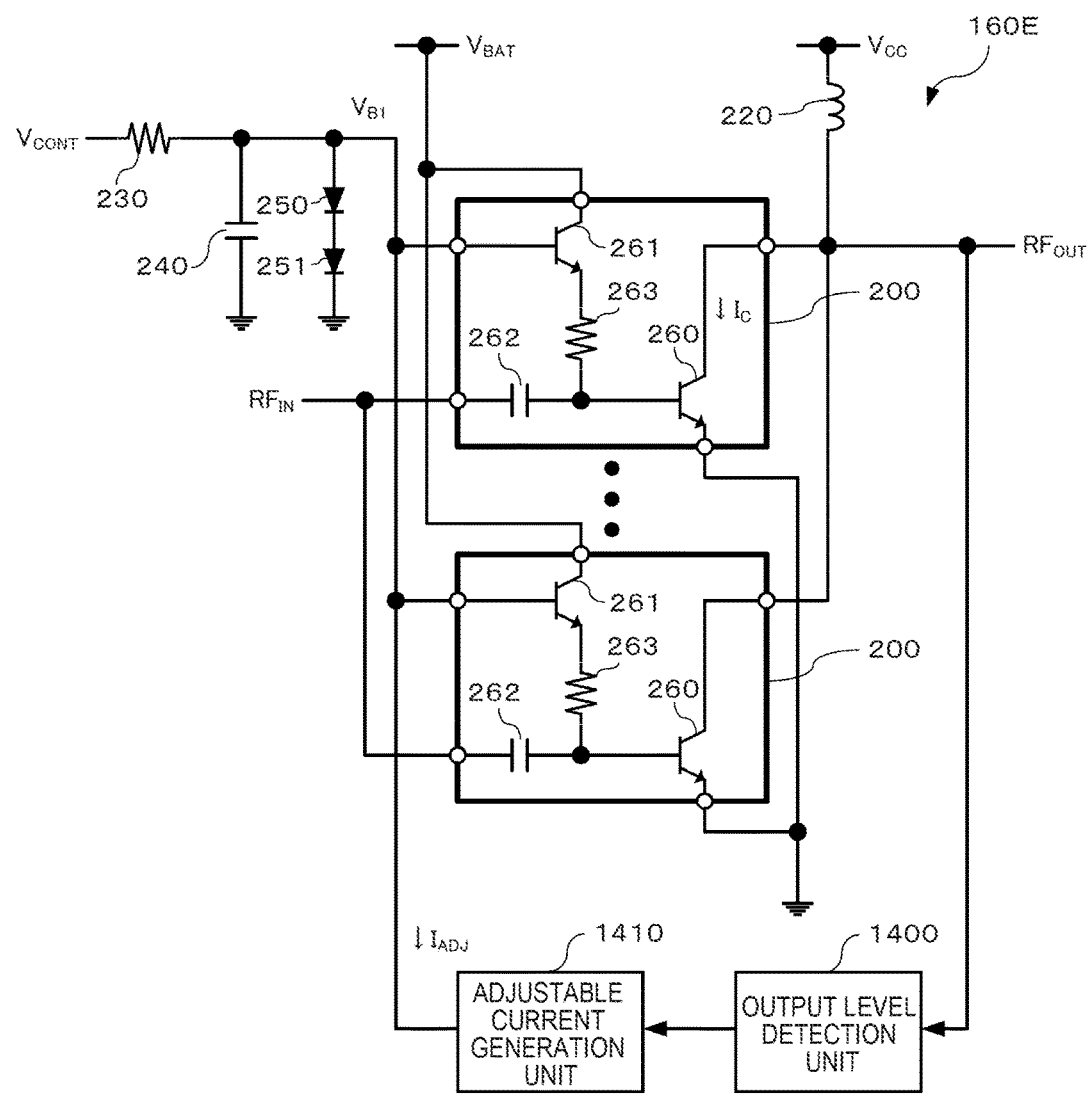
FIG. 14 is a diagram illustrating the configuration of a power amplifier 160E as still another example of the configuration of the power amplifier 160.

FIG. 14 is a diagram illustrating the configuration of a power amplifier 160E as still another example of the configuration of the power amplifier 160. Note that the same components as those in the power amplifier 160C are given the same reference numerals to omit the description thereof.

The power amplifier 160E includes an output level detection unit 1400 and adjustable current generation unit 1410 instead of the transistors 900, 901, the capacitor 902, and the resistor 903 in the power amplifier 160C.

The output level detection unit 1400 detects the output level of the power amplifier 160E and outputs it to the adjustable current generation unit 1410.

Based on the detection result of the output level detection unit 1400, the adjustable current generation unit 1410 generates adjustable current $I_{ADJ}$ increasing with the output level. This adjustable current $I_{ADJ}$ is supplied through the resistor 230.

In the power amplifier 160E, the adjustable current $I_{ADJ}$ increases as the output level increases. When the adjustable current $I_{ADJ}$ increases, a voltage drop due to the resistor 230 becomes large, resulting in a decrease in the base voltage $V_{B1}$ of the transistor 261. The decrease in base voltage $V_{B1}$ decreases the voltage $V_{BAMP1}$ supplied to the base of the transistor 260, reducing the collector current of the transistor 260. This can lead to an improvement in power added efficiency at high output power in the power amplifier 160E.

Figure 15:
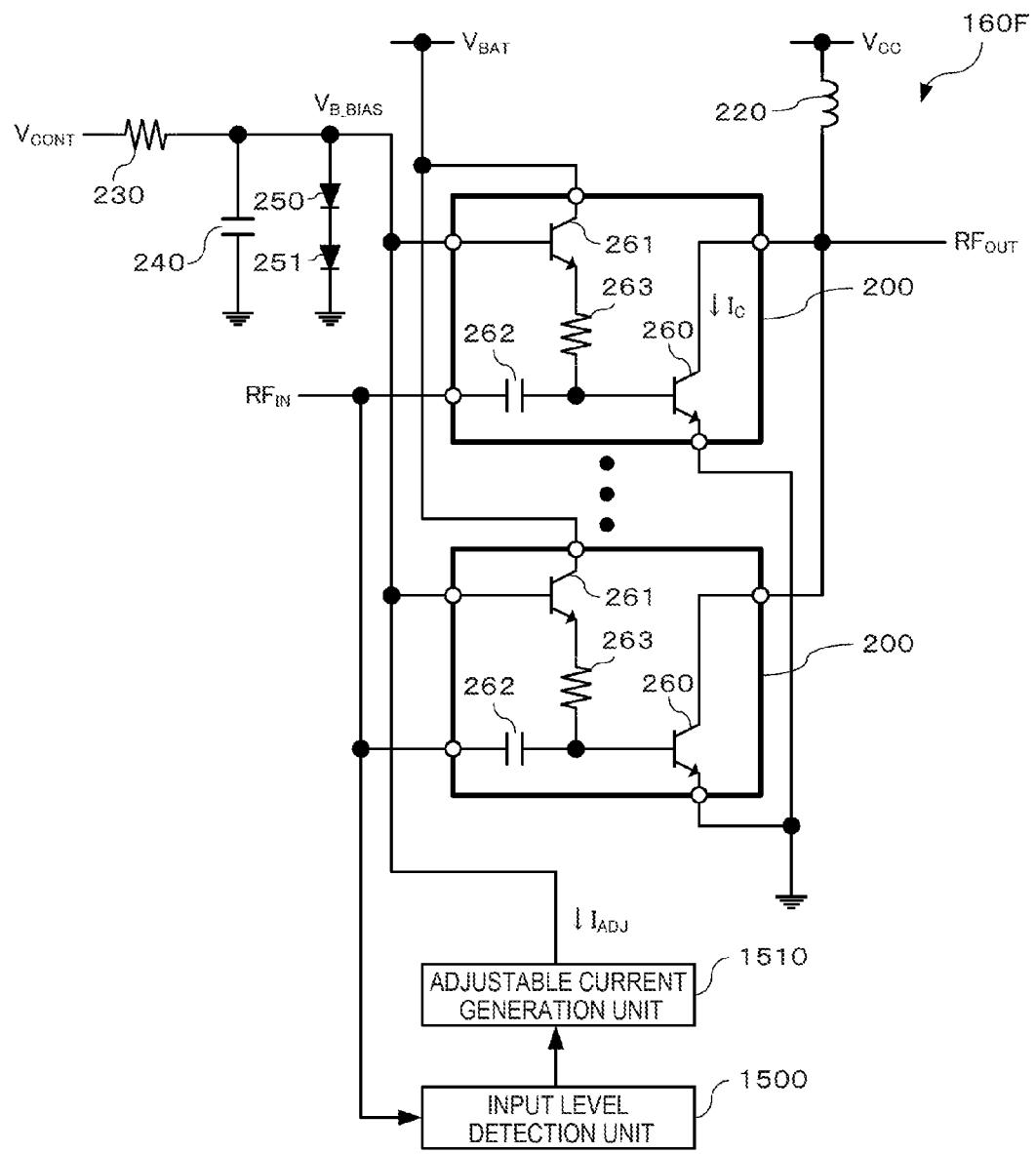
FIG. 15 is a diagram illustrating the configuration of a power amplifier 160F as yet another example of the configuration of the power amplifier 160.

FIG. 15 is a diagram illustrating the configuration of a power amplifier 160F as yet another example of the configuration of the power amplifier 160. Note that the same components as those in the power amplifier 160E are given the same reference numerals to omit the description thereof.

The power amplifier 160F includes an input level detection unit 1500 and an adjustable current generation unit 1510 instead of the output level detection unit 1400 and the adjustable current generation unit 1410 in the power amplifier 160E.

The input level detection unit 1500 detects the input level of the power amplifier 160F and outputs it to the adjustable current generation unit 1510.

Based on the detection result of the input level detection unit 1500, the adjustable current generation unit 1510 generates adjustable current $I_{ADJ}$ increasing with the input level. This adjustable current $I_{ADJ}$ is supplied through the resistor 230.

In the power amplifier 160F, the adjustable current $I_{ADJ}$ increases as the input level increases. When the adjustable current $I_{ADJ}$ increases, a voltage drop due to the resistor 230 becomes large, resulting in a decrease in the base voltage $V_{B1}$ of the transistor 261. The decrease in base voltage $V_{B1}$ decreases the voltage $V_{BAMP1}$ supplied to the base of the transistor 260, reducing the collector current of the transistor 260. This can lead to an improvement in power added efficiency at high output power in the power amplifier 160F.

The embodiments of the present disclosure have been described above. As illustrated in the power amplifiers 160A and 160B, the transistor 270 (whose collector is connected to the collector of the transistor 260 to amplify the RF signal input to the base and output the amplified signal from the collector) and the transistor 271 diode-connected to supply bias voltage or current from the emitter of the transistor 271 to the base of the transistor 270 are provided to decrease the base voltage $V_{B1}$ at high output power so that power added efficiency can be improved.

Further, as illustrated in the power amplifiers 160C and 160D, the diode-connected transistor 900 with the RF signal input to the base of the transistor 900, and the diode-connected transistor 901 whose emitter is connected to the base of the transistor 900, are provided to decrease the base voltage $V_{B1}$ at high output power so that power added efficiency can be improved.

Further, as illustrated in the power amplifier 160E, adjustable current $I_{ADJ}$ is generated according to the output level to decrease the base voltage $V_{B1}$ at high output power so that power added efficiency can be improved.

Further, as illustrated in the power amplifier 160F, adjustable current $I_{ADJ}$ is generated according to the input level to decrease the base voltage $V_{B1}$ at high output power so that power added efficiency can be improved.

Note that each of the embodiments described above is to make it easy to understand the present disclosure, and should not be interpreted to limit the present disclosure. The present disclosure can be modified and improved without departing from the spirit of the disclosure, and equivalents thereof are included in the present disclosure. In other words, each of the embodiments subjected appropriately to design change by those skilled in the art is included in the scope of the present disclosure as long as it has the features of the present disclosure. For example, each component included in each embodiment, and the arrangement, material, condition, shape, size, and the like thereof are not limited to illustrated ones, and can be appropriately changed. Further, respective components included in respective embodiments can be combined if technically possible, and the combined components are included in the scope of the present disclosure as long as they have the features of the present disclosure.

For example, such a configuration that power added efficiency is improved in the power amplifier 160 in the power stage of the power amplification module 120 is illustrated in the embodiments, but a configuration equivalent to that of the power amplifier 160 can also be employed in the power amplifier 150 as the drive stage. The same holds for a configuration having three-stage power amplifiers or more.

DESCRIPTION OF REFERENCE NUMERALS

100 transmitting unit
110 modulation unit
120 power amplification module
130 front end unit
140 antenna
150, 160 power amplifier
200, 210, 800, 810 unit cell
220 inductor
230, 263, 273, 903 resistor
240, 262, 272, 902 capacitor
250, 251 diode
260, 261, 270, 271, 900, 901 transistor
1400 output level detection unit
1410, 1510 adjustable current generation unit
1500 input level detection unit

What is claimed is:

1. A power amplifier comprising:
   a first transistor for amplifying an input signal input to a base of the first transistor and outputting an amplified signal from a collector of the first transistor;
   a second transistor with power-supply voltage applied to a collector of the second transistor to supply a first bias voltage or a first bias current from an emitter of the second transistor to the base of the first transistor;
   a third transistor whose collector is connected to the collector of the first transistor to amplify the input signal input to a base of the third transistor and output the amplified signal from a collector of the third transistor;
   a fourth transistor whose base and collector are connected to supply a second bias voltage or a second bias current from an emitter of the fourth transistor to the base of the third transistor; and
   a first resistor with a bias control voltage applied to one end of the first resistor and the other end of the first resistor connected to the bases of the second and fourth transistors, current flowing into the base of the first transistor and the base of the third transistor through the first resistor.

2. The power amplifier according to claim 1, further comprising a plurality of the first transistors, wherein the collectors of the plurality of the first transistors are commonly connected.

3. The power amplifier according to claim 2, further comprising a plurality of third transistors, wherein the collectors of the plurality of the third transistors are commonly connected.

4. The power amplifier according to claim 1, wherein the first transistor and second transistor form a first unit cell, and the third transistor and fourth transistor form a second unit cell, and wherein the power amplifier comprises a plurality of first unit cells.

5. The power amplifier according to claim 4, wherein the power amplifier comprises a plurality of second unit cells.

6. The power amplifier according to claim 1, wherein a voltage drop across the first resistor increases as an output level of the amplified signal increases.

7. A power amplifier comprising:
   a first transistor for amplifying an input signal input to a base of the first transistor and outputting the amplified signal from a collector of the first transistor;
   a second transistor with power-supply voltage applied to a collector of the second transistor to supply a bias voltage or a bias current from an emitter of the second transistor to the base of the first transistor;
   a fifth transistor whose collector and base are connected, and to whose base the input signal is input;
   a sixth transistor whose collector and base are connected, and whose emitter is connected to the base of the fifth transistor; and
   a first resistor with a bias control voltage applied to one end of the first resistor and the other end connected to the bases of the second and sixth transistor.

8. The power amplifier according to claim 4, comprising a plurality of the first transistors whose collectors are commonly connected.

9. The power amplifier according to claim 8, wherein the emitter of the second transistor supplies the bias voltage or the bias current from the emitter of the second transistor to each of the bases of the plurality of the first transistors.

10. The power amplifier according to claim 7, wherein a voltage drop across the first resistor increases as an output level of the amplified signal increases.

* * * * *